US012543534B2

(12) United States Patent
Hsu et al.

(10) Patent No.: US 12,543,534 B2
(45) Date of Patent: Feb. 3, 2026

(54) STORAGE BUFFER FOR AUTOMATED MATERIAL HANDLING SYSTEM

(71) Applicant: Taiwan Semiconductor Manufacturing Company, Ltd., Hsinchu (TW)

(72) Inventors: Chieh Hsu, Hsinchu (TW); Guancyun Li, Miaoli County (TW); Ching-Jung Chang, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 260 days.

(21) Appl. No.: 18/163,027

(22) Filed: Feb. 1, 2023

(65) Prior Publication Data

US 2024/0258146 A1    Aug. 1, 2024

(51) Int. Cl.
*H01L 21/677* (2006.01)

(52) U.S. Cl.
CPC .... *H01L 21/67736* (2013.01); *H01L 21/6773* (2013.01); *H01L 21/67733* (2013.01); *H01L 21/67769* (2013.01)

(58) Field of Classification Search
CPC ......... H01L 21/67769; H01L 21/67736; H01L 21/677; H01L 21/6773; H01L 21/67775
USPC ....... 414/273, 272, 277, 278, 281, 282, 283, 414/331.02, 331.04, 331.11, 331.1, 414/331.09
See application file for complete search history.

(56) References Cited

U.S. PATENT DOCUMENTS

| | | | |
|---|---|---|---|
| 5,593,269 A * | 1/1997 | Bernard, II | B65G 1/1371 211/1.51 |
| 9,852,934 B2 | 12/2017 | Hsieh | |
| 10,262,882 B2 | 4/2019 | Hsieh | |
| 2002/0106271 A1* | 8/2002 | Remericq | B65G 47/5122 414/331.04 |
| 2004/0101386 A1* | 5/2004 | Robey | B65G 1/127 414/331.1 |
| 2007/0128007 A1* | 6/2007 | Bonora | H01L 21/67775 414/217 |
| 2010/0138016 A1 | 6/2010 | Chen | |
| 2013/0223961 A1* | 8/2013 | Hanel | B65G 1/127 414/331.02 |
| 2020/0115160 A1* | 4/2020 | Maeda | H01L 21/67715 |
| 2020/0211881 A1* | 7/2020 | Kuwahara | H01L 21/6773 |

FOREIGN PATENT DOCUMENTS

WO    2021051116 A1    3/2021

* cited by examiner

*Primary Examiner* — Glenn F Myers
(74) *Attorney, Agent, or Firm* — HAYNES AND BOONE, LLP

(57) ABSTRACT

Storage systems and method of using the same are provided. An exemplary storage system according to the present disclosure includes a storage device including a plurality of storage locations arranged in an upright stadium shape and a plurality of load ports each movable to engage any of the plurality of storage locations.

20 Claims, 17 Drawing Sheets

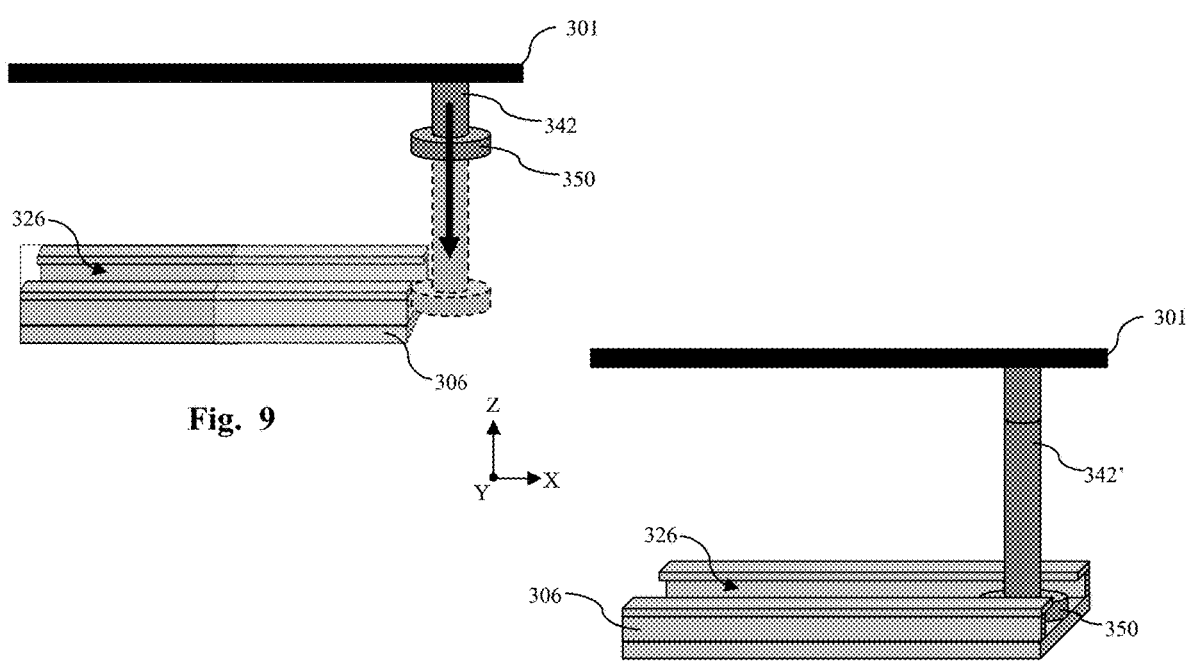

STORAGE BUFFER FOR AUTOMATED MATERIAL HANDLING SYSTEM

BACKGROUND

The manufacture of semiconductor devices involves the performance of a series of process steps using a variety of high-tech production and metrology tools in a certain order and often within a certain period of time. The primary function of a wafer logistics system in a wafer fabrication facility, or "fab," is to deliver the wafers to each of the tools at the right time, as well as to track the location and status of the wafers throughout the process. Automated material handling systems ("AMHS") are implemented to wafer fabs to carry out the automated functions more efficiently, consistently, and safely than can be done via manual means.

An AMHS includes an overhead hoist transport ("OHT") system that includes rails that are mounted to the ceiling of a fab floor. OHT vehicles or OHT carriers can travel along the rails to transport wafers, reticles, or other material among different loading ports of different tools and storage devices. Existing storage devices include fixed load ports that have limited buffer. In case of heavy carrier flow, occupied load ports may cause stoppage of AMHS carriers on the track, resulting in a gridlock. Therefore, although existing AMHS storage devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 7-10 illustrate perspective views and fragmentary cross-sectional views of a second storage system 300 that includes a retractable load port, according to one or more aspects of the present disclosure.

DETAILED DESCRIPTION

Figure 1:
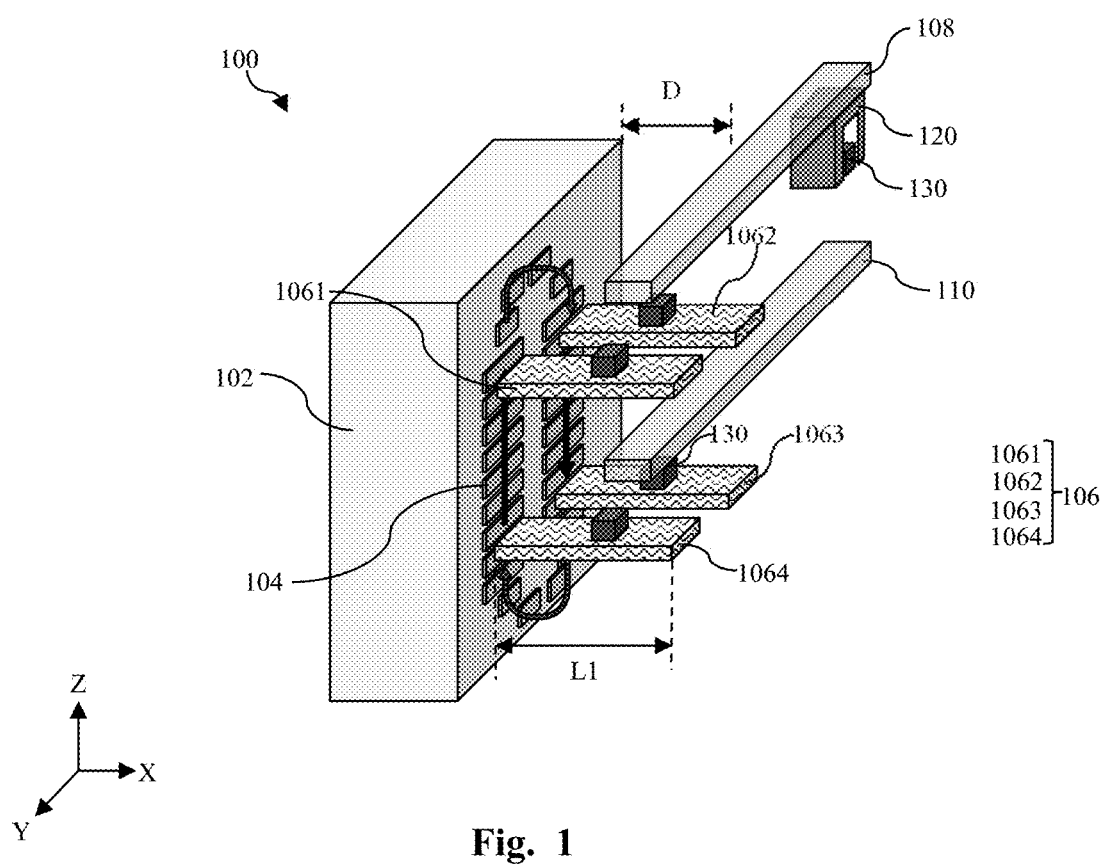
FIGS. 1-4 illustrate perspective views of a first storage system 100 at various stages of operation, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

In modern semiconductor fabrication facilities, overhead hoist transport (OHT) systems are extensively used to automate the material transport process within a wafer fabrication facility (fab) or even among multiple fabs. The material being transported may include wafers and reticles. Within a fab, an OHT system is made suitable for long-distance interbay transport among different wafer processing bays as well as short-distance intrabay transport within a single wafer processing bay. In general, dispatching needs in the OHT system is controlled by an automated material handling system (AMHS). When being transported, wafers (or workpieces) are placed in a wafer carrier (e.g., a front opening unified pod "FOUP" or "a standard mechanical interface (SMIF) pod. An OHT vehicle can travel along a track to different locations to vertically load and unload a wafer carrier or a reticle box onto a load port to a process machine or a storage device. In some existing technology, the load port on a storage device is fixed and has a limited buffer to temporarily store a load. When the buffer is used up, the OHT vehicle can no longer unload additional wafer carriers on the load port and a loaded OHT vehicle has to park on the track, blocking the traffic behind it. This gridlock may reduce the throughput and efficiency of the fab.

The present disclosure is directed to rotational or expandable load ports that can provide additional buffer to prevent traffic stoppage on OHT tracks. In some embodiments, storage locations or compartments are arranged in an upright stadium shape. More than one load port may be mechanically rotated clockwise or counterclockwise along the upright stadium shape to selectively engage the storage locations. In operation, when the buffer of a load port is occupied, the occupied load port may be rotated away from the loading position and a vacant load port may be rotated into the loading position. The additional buffer allows a more continuous and undisrupted OHT operation. In some other embodiments, a load port is retractable to move clear of an adjacent track. When there are more than one adjacent track, the load port may be movable between different levels to receive loads from different tracks. In still some other embodiments, the load port is configured to expand or upfold to increase its surface area for additional buffer over the load port.

FIGS. 1-4 illustrate a first storage system 100 according to various aspects of the present disclosure. The first storage system 100 includes a storage device 102, which include a plurality of storage locations. The storage device 102 may be a vertical stocker, a tower, or a vertical carousel. In the embodiments illustrated in FIGS. 1-4, the storage locations 104 are arranged in an upright stadium shape and are movable clockwise or counterclockwise around the upright stadium shape. The first storage system 100 further includes a plurality of rotational load ports 106. In the depicted embodiments, the plurality of rotational load ports 106 include a first load port 1061, a second load port 1062, a third load port 1063, and a fourth load port 1064. The number of load ports shown in FIGS. 1-4 is not intended to be limiting and the plurality of rotational load ports 106 may include less or more than 4 load ports. Each of the plurality of rotational load ports 106 is movable along the upright stadium shape to selectively engage one of the storage locations 104. In the illustrated embodiments, the storage device 102 is disposed adjacent to a first track 108 and a second track 110 that is disposed below the first track 108. OHT vehicles 120 may travel along the first track 108 or the second track 110. In some embodiments, the first track 108 and the second track 110 may each include a single rail (as a monorail system) or two rails (as a dual rail system). Each of the OHT vehicles 120 is equipped with a gripper to load or unload a load 130 to the first track 108 and the second track 110.

Reference is made to FIG. 1. The first load port 1061 and the second load port 1062 are at a first level ready to receive a load 130 from an OHT vehicle 120 travelling on the first track 108. The third load port 1063 and the fourth load port 1064 are a second level to receive a load 130 from an OHT vehicle 120 travelling on the second track 110. Likewise, the OHT vehicle 120 on the first track 108 may pick up a load 130 disposed on the first load port 1061 and the second load port 1062 and an OHT vehicle 120 on the second track 110 may pick up a load 130 disposed on the third load port 1063 and the fourth load port 1064. Along the X direction, the first track 108 and the second track 110 are spaced apart from a surface of the storage device 102 by a distance (D). Each of the first load port 1061, the second load port 1062, the third load port 1063, and the fourth load port 1064 measures, lengthwise along the X direction, a first length (L1). As will be described further below, the first load port 1061, the second load port 1062, the third load port 1063, and the fourth load port 1064 shown in FIG. 1 are in an extended position (or an extended mode) as each of them extend away from the storage device 102 under the first track 108 and the second track 110.

Figure 2:
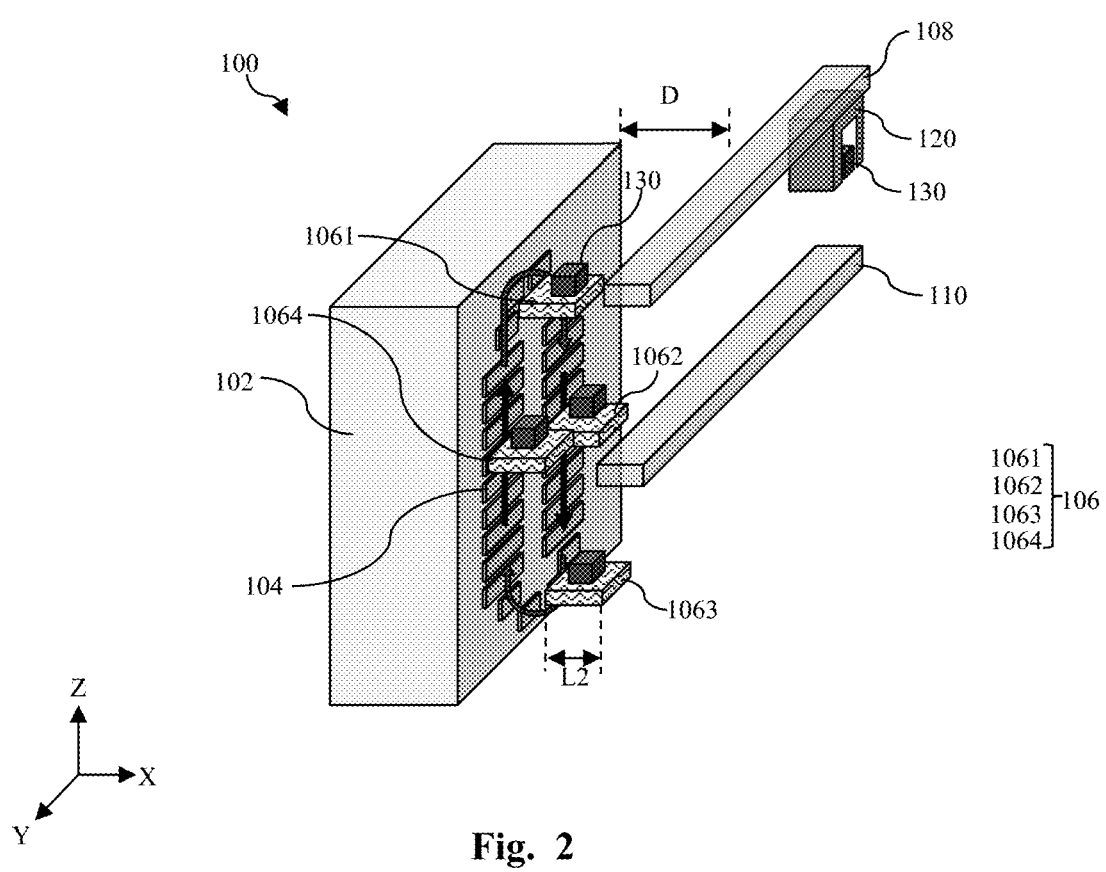
Figure 3:
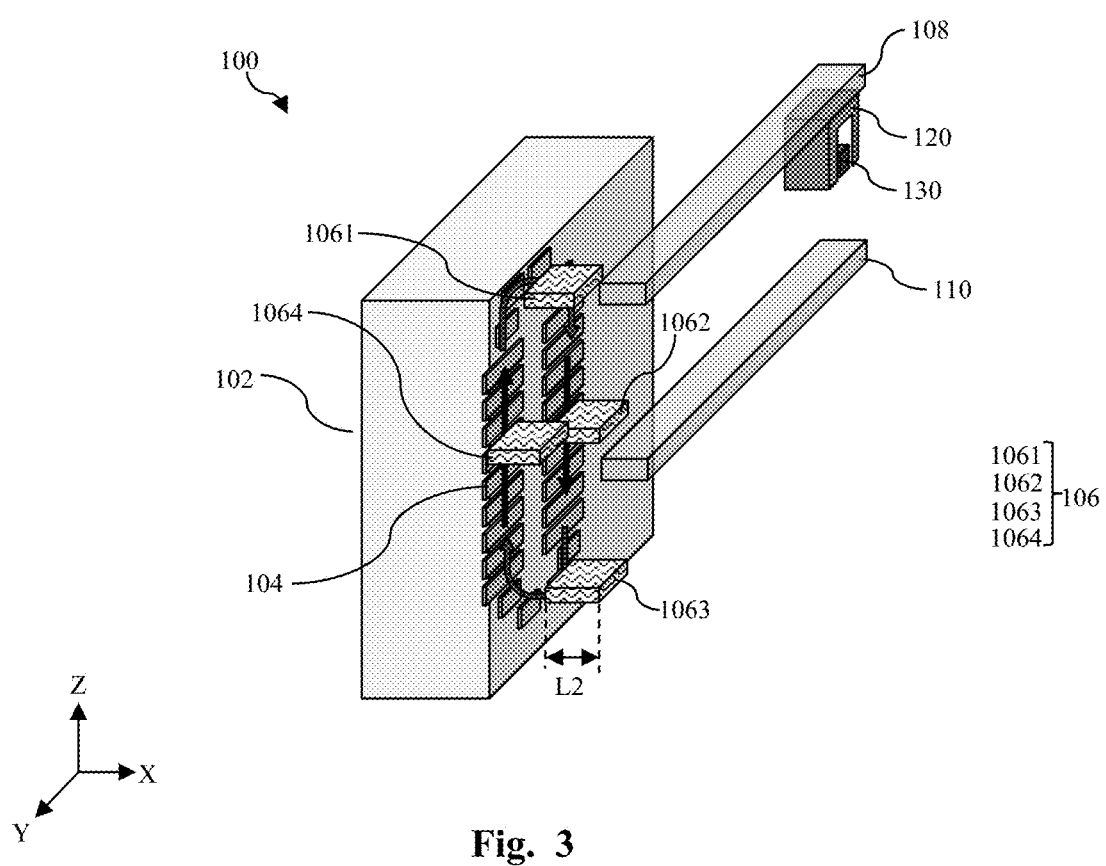
Figure 4:
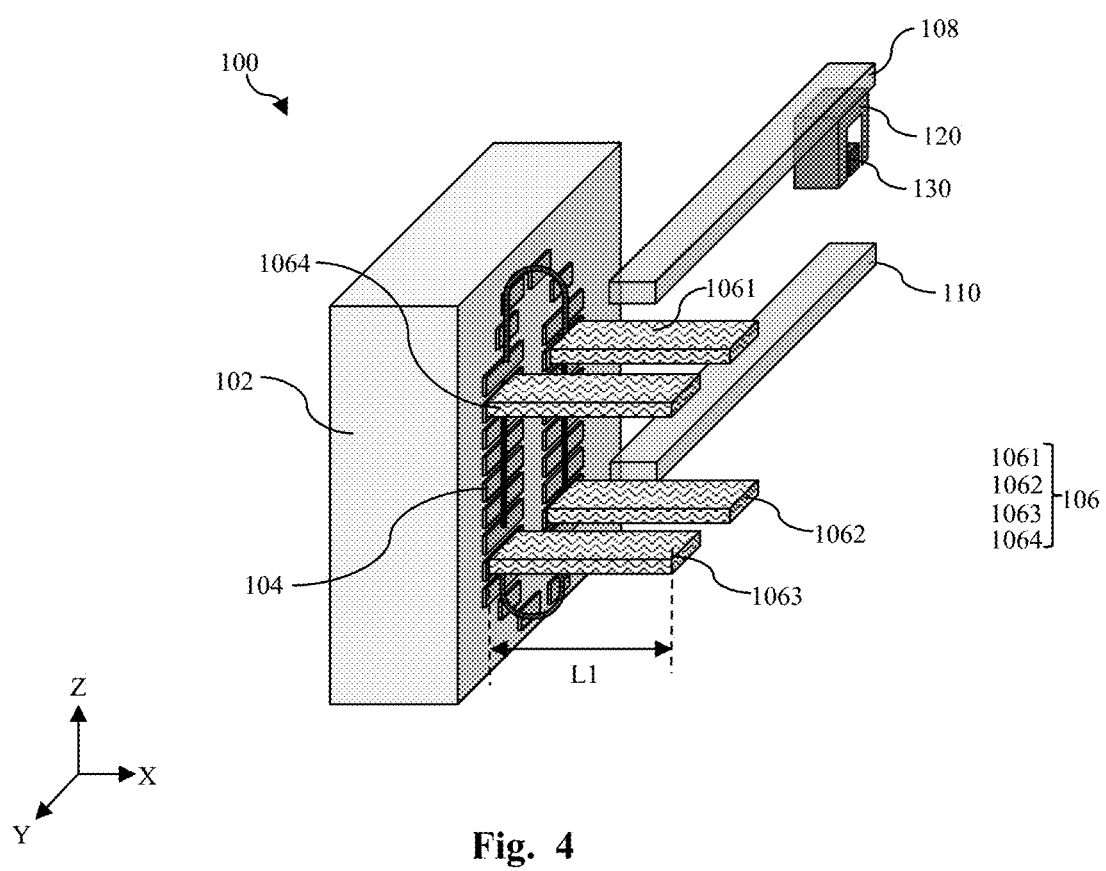

FIGS. 2-4 illustrate movements of the first load port 1061, the second load port 1062, the third load port 1063, and the fourth load port 1064 along the upright stadium shape of the storage locations 104. Reference is first made to FIG. 2. In order for the first load port 1061, the second load port 1062, the third load port 1063, and the fourth load port 1064 to move clear of the first track 108 and the 110, each of them retracts to a retracted position (or a retracted mode). As shown in FIG. 2, at the retracted positions, each of the first load port 1061 of the second load port 1062, the third load port 1063, and the fourth load port 1064 measures a second length (L2) away from the surface of the storage device 102 along the X direction. The first length L1 is greater than the second length L2 to extend under the first track 108 or the second track 110. Additionally, the second length L2 is smaller than the distance D such that a terminal end of any of the plurality of load ports 106 is spaced apart from the first track 108 and the second track 110 as it moves clockwise or counterclockwise around the upright stadium shape of the storage locations 104. In FIG. 2, the retracted first load port 1061, the second load port 1062, the third load port 1063, and the fourth load port 1064 move clockwise while carrying a load 130. In FIG. 3, once each of the first load port 1061, the second load port 1062, the third load port 1063, and the fourth load port 1064 engages a storage location 104, the load 130 is unloaded into the respective storage location. After the load 130 is unloaded from the first load port 1061, the second load port 1062, the third load port 1063, and the fourth load port 1064, the vacant load ports continue to move clockwise along the upright stadium shape until the fourth load port 1064 and the first load port 1061 are at the first level and the third load port 1063 and the second load port are at the second level, as shown in FIG. 4. Once in position, the load ports extend to the extended position. That is, as shown in FIG. 4, each of the first load port 1061, the second load port 1062, the third load port 1063, and the fourth load port 1064 increases its length along the X direction to the first length L1, shifting to the extended position. In FIG. 4, the fourth load port 1064 and the first load port 1061 extend below the first track 108 to receive from or unload to an OHT vehicle 120 travelling on the first track 108. Similarly, the third load port 1063 and the second load port 1062 extend below the second track 110 to receive from or unload to an OHT vehicle 120 travelling on the second track 110.

It should be appreciated that the first load port 1061, the second load port 1062, the third load port 1063, and the fourth load port 1064 in FIG. 4 may retract to their retracted positions and move clockwise again with or without a load 130. Additionally, it is not necessary for each of the load ports to carry a load 130 in its retracted position, as representatively shown in FIG. 2. The rotating movement of the load ports (such as the first load port 1061, the second load port 1062, the third load port 1063, and the fourth load port 1064) allows that load ports to move and unload to an available storage location. Additionally, the rotational movement makes it convenient to move loads among different levels. For example, if the second load port 1062 in FIG. 2 does not unload to an available storage location a load it receives at the first level but carries the load 130 to the second level, the load on the second load port 1062 effectively changes from the first level (corresponding to the first track 108) to the second level (corresponding to the second track 110).

Figure 5:
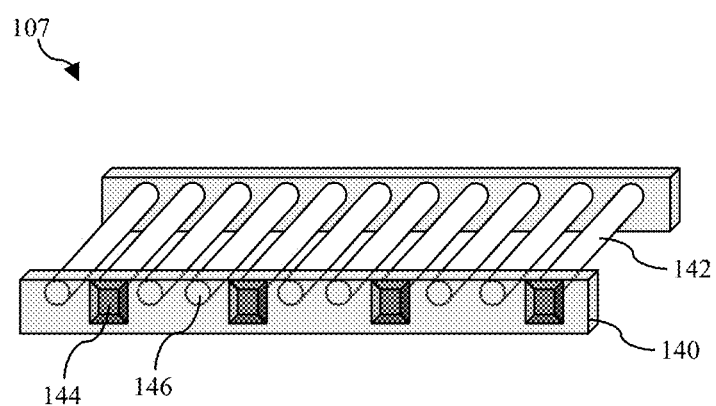
FIG. 5 illustrates motorized conveyor rollers that may be implemented on a rotational loading port of the first storage system 100 in FIGS. 1-4, according to one or more aspects of the present disclosure.

In order to move a load 130 along its length, each of the first load port 1061, the second load port 1062, the third load port 1063, and the fourth load port 1064 includes a conveyor system, such as a conveyor belt and a series of motorized conveyor rollers. In some embodiments, each of the first load port 1061, the second load port 1062, the third load port 1063, and the fourth load port 1064 includes a motorized conveyor roller system 107 shown in FIG. 5. The motorized conveyor roller system 107 includes a frame 140, a plurality of motorized rollers 142, and electric motors 144 mechanically coupled to the plurality of motorized rollers 142. In some alternative embodiments not explicitly shown, the electric motor 144 is disposed within a motorized roller 142. Besides motorized rollers 142, the motorized conveyor roller system 107 includes idler rollers 146 that are not motorized or powered. The use of a motorized conveyor roller system, such as 107 shown in FIG. 5, allows the first load port 1061, the second load port 1062, the third load port 1063, and the fourth load port 1064 to be switchable between a retracted position (or a retracted mode) and an extended position (or an extended mode).

Figure 6:
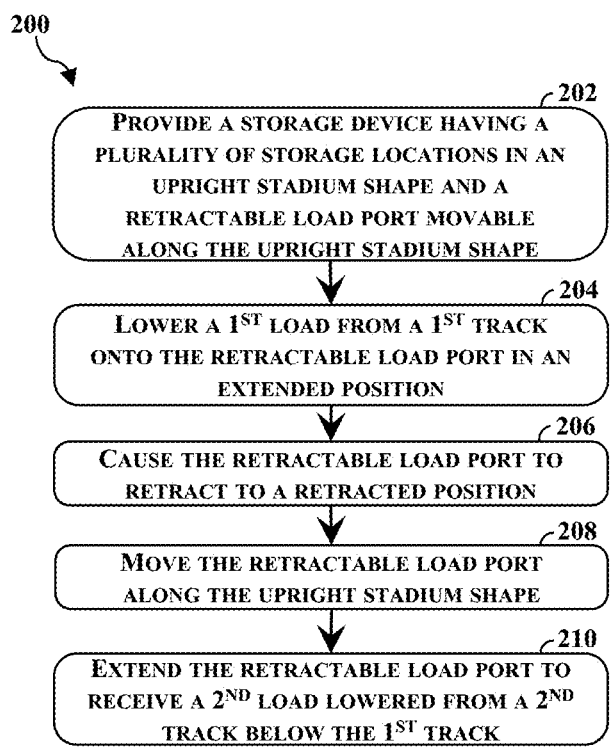
FIG. 6 illustrates a flowchart of a method 200 to use the first storage system 100 shown in FIGS. 1-4 to increase storage buffer, according to one or more aspects of the present disclosure.

FIG. 6 illustrates a flowchart of a method 200 of using the first storage system 100 shown in FIGS. 1-4. Method 200 is merely an example and is not intended to limit the present disclosure to what is explicitly illustrated in method 200. Additional steps may be provided before, during and after method 200, and some steps described can be replaced, eliminated, or moved around for additional embodiments of the methods. Not all steps are described herein in detail for reasons of simplicity. Method 200 is described below in conjunction with FIGS. 1-4. As will be described further below, method 200 or a variant thereof may apply to other storage system of the present disclosure. For example, method 200 may apply to a second storage system 300 shown in FIGS. 7 and 8.

As illustrated in FIG. 6, method 200 includes blocks 202, 204, 206, 208, and 210. At block 202, a storage device, such as the storage device 102 in FIGS. 1-4, is provided. The storage device includes a plurality of storage locations, such as the storage locations 104 shown in FIGS. 1-4, arranged in an upright stadium shape. Additionally, the storage system includes a retractable load port, such as any of the load ports 106 shown in FIGS. 1-4, that is movable along the upright stadium shape. At block 204, a first load is lowered from a first track (such as the first track 108 shown in FIGS. 1-4) onto the retractable load port while it is in an extended position. At block 206, in order to move clear of the adjacent tracks, the retractable load port is caused to retract to a retracted position. As is shown in FIG. 2, each of the first load port 1061, the second load port 1062, the third load port 1063, and the fourth load port 1064 retracts from the first length L1 to the second length L2, which is smaller than the distance D between storage device 102 and any of the first track 108 and the second track 110. The smaller second length L2 allows the load ports 106 to rotate around the upright stadium shape without hitting the first track 108 and the second track 110. At block 208, the retractable load port moves along the upright stadium shape. As shown in FIGS. 1 and 2, each of the first load port 1061, the second load port 1062, the third load port 1063, and the fourth load port 1064 moves clockwise along the upright stadium shape to engage different storage locations. At block 210, the retractable load port is extended to the receive a second load lowered from a second track below the first track. Reference is made to FIG. 4. Once of the fourth load port 1064 and the first load port 1061 are at the first level and the third load port 1063 and the second load port 1062 are at the second level, the load ports 106 extend to the second length L2 to receive loads from the first track 108 and the second track 110.

Figure 7:
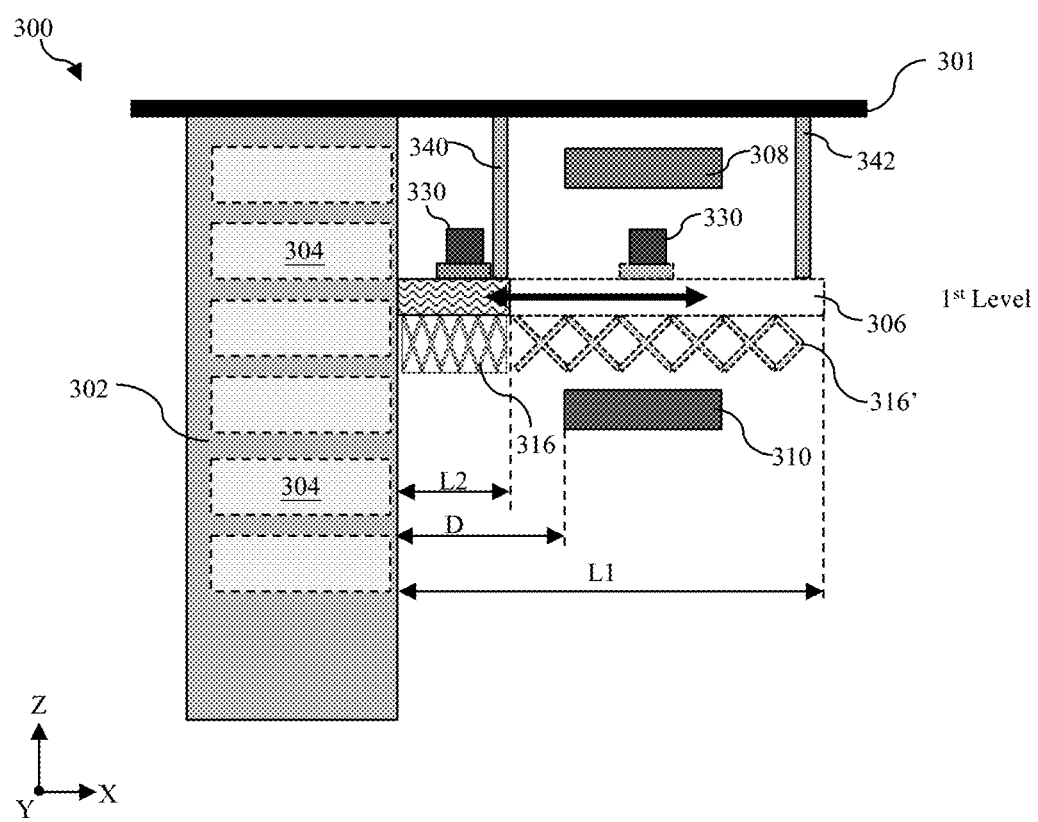
Figure 8:
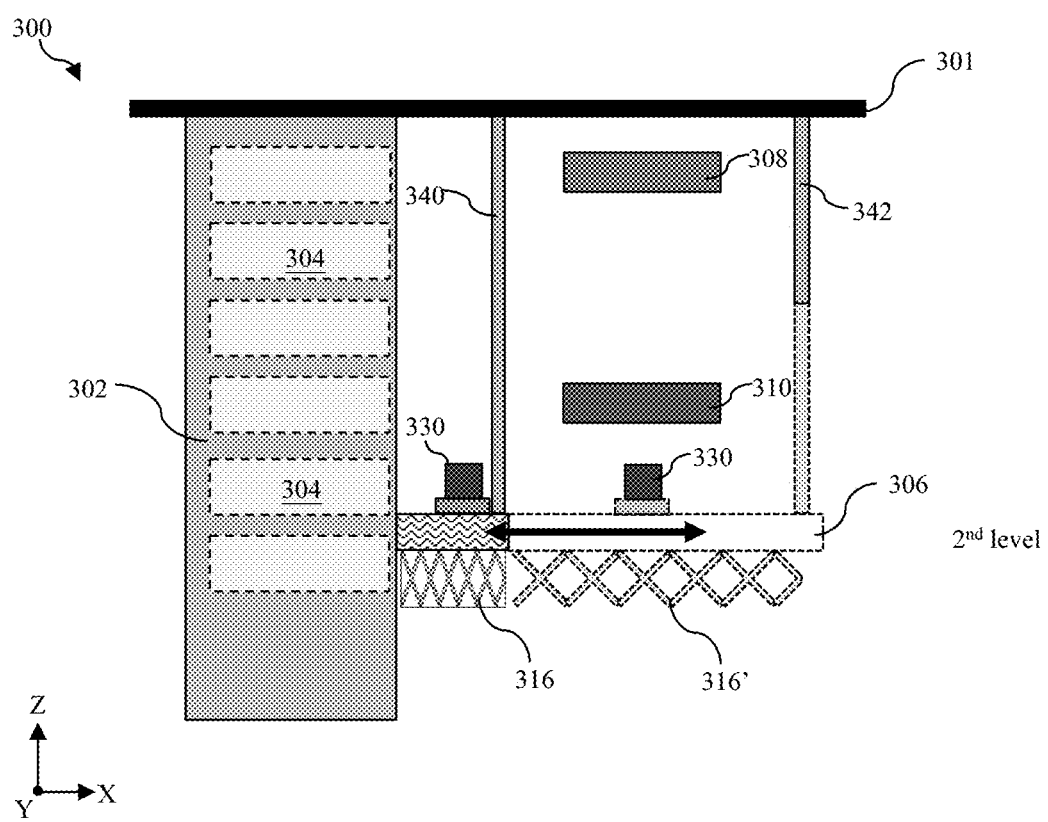

FIGS. 7 and 8 illustrate a second storage system 300. The second storage system 300 includes a storage device 302 hung from a ceiling 301. The storage device 302 may be a vertical stocker or a tower that includes multiple storage locations 304. The second storage system 300 further includes a first track 308 and a second track 310 disposed below the first track 308. The first track 308 and the second track 310 are spaced apart from the storage device 302 by a distance D. In the embodiments illustrated in FIGS. 7-8, the storage locations 304 are arranged vertically. The second storage system 300 further includes a retractable load port 306. The retractable load port 306 may be switchable between a extended position with a first length L1 and a retracted position with a second length L2. The first length L1 is greater than the distance D such that the retractable load 306 can receive loads from or unload loads to the first track 308 or the second track 310. The second length L2 is smaller than the distance D such that the retractable load 306 does not hit the first track 308 and the second track 310 when it moves up and down. In the depicted embodiments, the retractable load port 306 is supported by a scissor-type extension arm 316. When the retractable load port 306 is in the retracted position, the scissor-type extension arm 316 stays retracted. When the retractable load port 306 extends to the extended position, the scissor-type extension arm enters into an extended position 316' (or an extended mode 316'). When retracted, the retractable load port 306 may move between a first level shown in FIG. 7 and a second level shown in FIG. 8. When at the first level, the retractable load port 306 is configured to receive from or unload to an OHT vehicle travelling on the first track 308. When at the second level, the retractable load port 306 is configured to receive from or unload to a load 330 an OHT vehicle travelling on the second track 310.

To maintain the structural integrity of the retractable load port 306, the retractable load port 306 is supported by at least one retractable hanger, such as a first hanger 340 and a second hanger 342 hung from the ceiling 301. Lengths of both the first hanger 340 and the second hanger 342 can change to support the retractable load port 306 at the first level and the second level. For example, the first hanger 340 and the second hanger 342 are in retracted positions in FIG. 7 to support the retractable load port 306 at the first level. To move clear of the second track 310, the retractable load port 306 retracts to the retracted position. The retracted retractable load port 306 is then lowered to the second level. In some embodiments, the lowering of retractable load port 306 may be achieved with the assistance of the first hanger 340. While not explicitly shown in FIGS. 7-8, when the retractable load port 306 retracts, it disengages or break free from the second hanger 342 and is only supported by the first hanger 340, which is permanently attached to the retractable load port 306.

Reference is now made to FIG. 8. After the retracted retractable load port 306 is at the second level, it extends along the X direction below the second track 310 and reengage the second hanger 342. Once reengaged, the second hanger 342 also supports the weight of the retractable load port 306. The disengagement and engagement between the second hanger 342 may be achieved using the structures shown in FIGS. 9 and 10. In some embodiments depicted in FIG. 9, the second hanger 342 includes a roller mechanism 350 mounted on a terminal surface of the second hanger 342 and the retractable load port 306 includes a slide rail 326. In some instances, the slide rail 326 includes landing surfaces to slidably ride on the roller mechanism 350. The retractable load port 306 is configured to engage the second hanger 342 by moving along the X direction to the right and disengage the second hanger 342 by moving along the X direction to the left. As described above, the second hanger 342 is movable along the Z direction between the first level and the second level. FIG. 10 illustrates engagement of the second hanger 342 and the retractable load port 306. In FIG. 10, the landing surfaces of the slide rail 326 ride on the roller mechanism 350.

Because the second storage system 300 includes a retractable load port 306 that moves vertically between the first level and the second level, the method 200 in FIG. 6 generally applies to the use of the second storage system 300 with the exception that the storage locations 304 in the storage device 302 are arranged vertically, not in an upright stadium shape. At block 202, the storage device 302 is provided. The storage device 302 includes storage locations 304 arranged vertically and the retractable load port 306. At block 204, a first load is lowered from an OHT vehicle travelling along the first track 308 unto the retractable load port 306 in its extended position. At block 206, the retractable load port 306 is caused to retract from the extended position to the retracted position. As described above, while the first hanger 340 is permanently attached to the retractable load port 306, the second hanger 342 may disengage from and reengage with the retractable load port 306. At block 206, the retraction causes the retractable load port 306 to disengage from the second hanger 342. At block 208, the retracted retractable load port 306 is lowered to the second level along the storage locations 304. At block 210, once the retracted retractable load port 306 is at the second level, it extends into the extended position and reengages the second hanger 342. At the second level, the retractable load port 306 is configured to receive from or unload to an OHT vehicle travelling on the second track 310.

Figure 11:
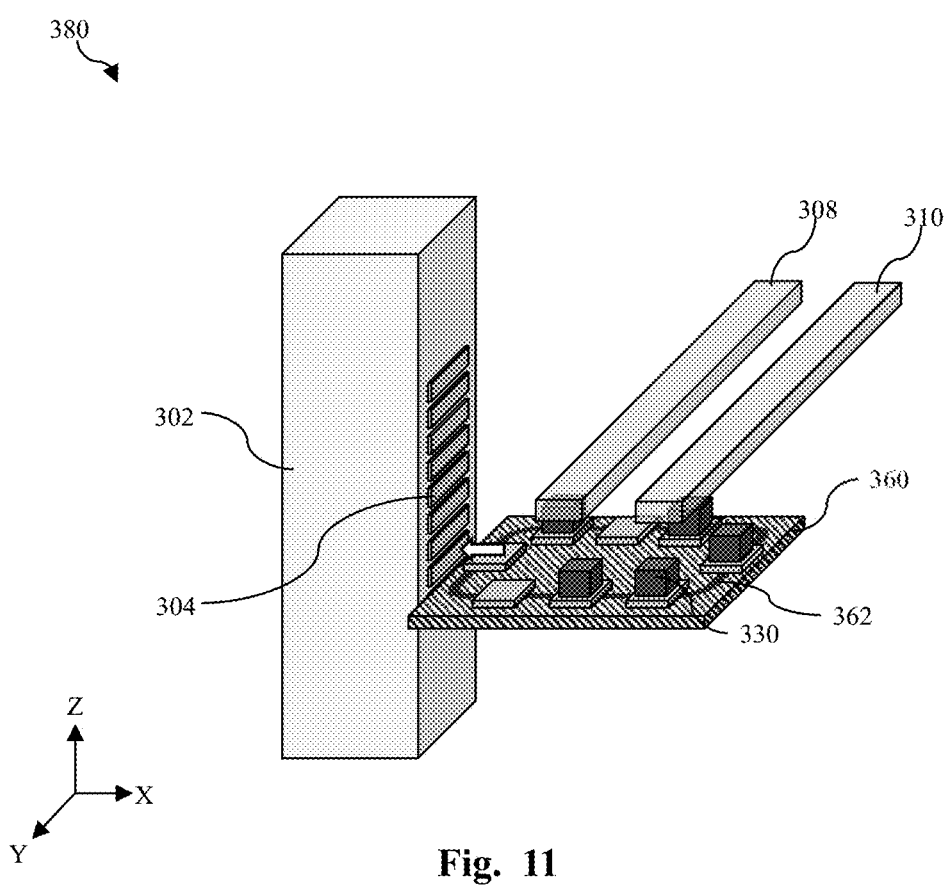
FIG. 11 illustrates a perspective view of a third storage system 380 that includes a loading port having a closed loop conveyor, according to one or more aspects of the present disclosure.

FIG. 11 illustrates a third storage system 380. The third storage system 380 includes a storage device 302. The storage device 302 may be a vertical stocker or a tower that includes multiple storage locations 304. The storage device 302 may be hung from a ceiling. The third storage system 380 further includes a first track 308 and a second track 310 that are placed side-by-side and extending parallel to one another. The storage locations 304 are arranged and movable vertically. The third storage system 380 further includes a load table 360. In some embodiments represented in FIG. 11, the load table 360 resembles a horizontal carousel configured to move multiple loads 330 around the load table on the X-Y plane. In the depicted embodiments, OHT vehicles travelling on the first track 308 and the second track 310 may pick up or unload a load 330 onto the load table 360. Once a load 330 is unloaded to load table 360, the load 330 may be moved around a closed loop 362 on the load table 360 to create vacant spots to receive further loads from the first track 308 and second track 310. As indicated by the arrow, once a load 330 is rotated to a position closer to the storage device 302, the load 330 may be transported or stored away to a vacant storage location 304. In some embodiments, the load table 360 is equipped with a conveyor belt, carts, or motorized conveyor rollers arranged around a top surface of the load table 360. In one embodiment, the load table 360 includes a first set of conveyor rollers (arranged along the closed loop 362) to move loads around the load table 360 in a closed loop and a second set of conveyor rollers to transport a load 330 into a storage location 304. The second set of conveyor rollers may also be referred to as a delivery track.

Figure 12:
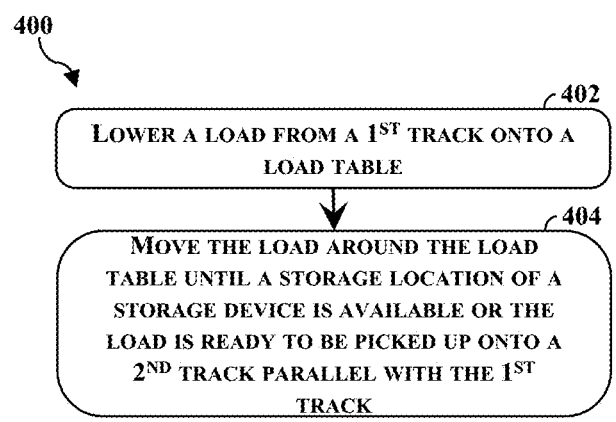
FIG. 12 illustrates a flowchart of a method 400 to use the third storage system 380 shown in FIG. 11 to increase storage buffer, according to one or more aspects of the present disclosure.

FIG. 12 illustrates a method 400 of using the third storage system 380. Method 400 is merely an example and is not intended to limit the present disclosure to what is explicitly illustrated in method 400. Additional steps may be provided before, during and after method 400, and some steps described can be replaced, eliminated, or moved around for additional embodiments of the methods. Not all steps are described herein in detail for reasons of simplicity. As illustrated in FIG. 12, method 400 includes blocks 402 and 404. At block 402, a load (such as the load 330 in FIG. 11) is lowered from a first track onto a load table (such as the load table 360). At block 404, the load is moved around the load table until a storage location (such as one of the storage locations 304 in FIG. 11) is available or the load is ready to be picked up on a second track extending parallel to the first track. Reference is made to FIG. 11. After a load 330 is lowered from the first track 308 onto the load table 360, the load 330 may be moved clockwise or counterclockwise to a position suitable for the load 330 to be picked up by an OHT vehicle travelling on the second track 310. That is, the load table 360 may be used to move a load 330 from the first track 308 to the second track 310. This is especially useful when the first track 308 and the second track 310 lead to different process tools.

Figure 13:
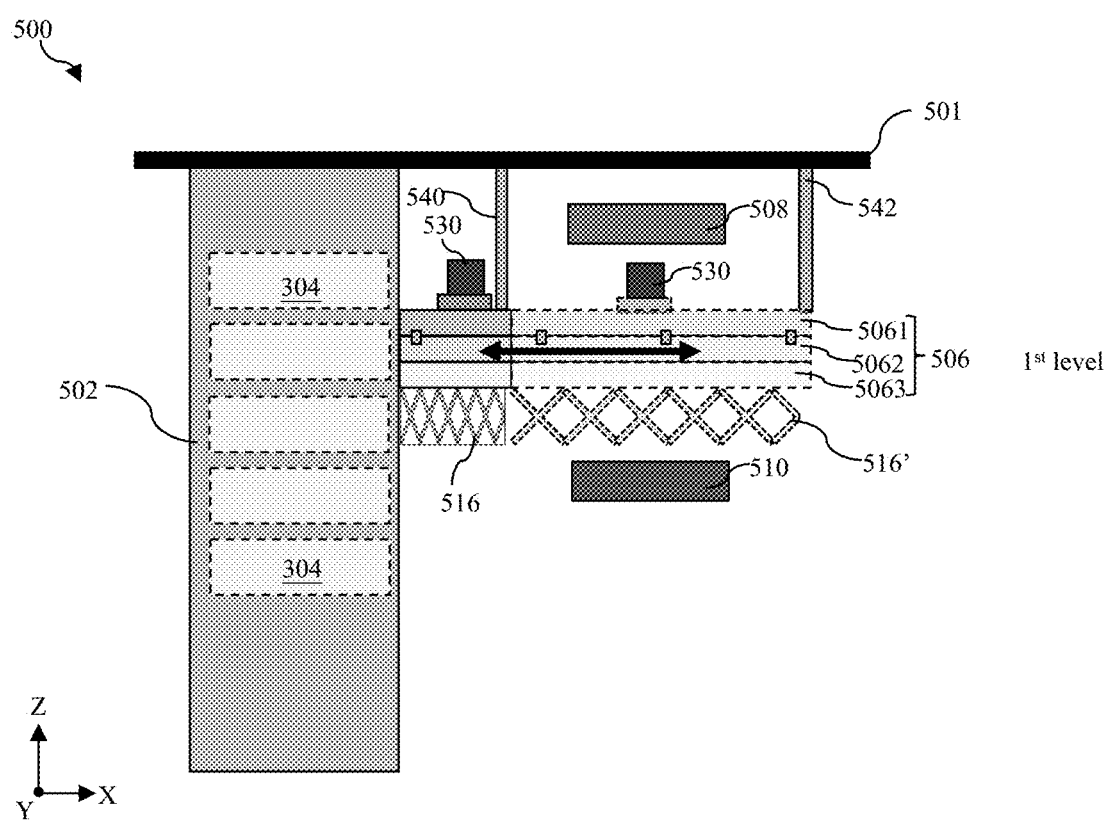
FIGS. 13 and 14 illustrate perspective views of a fourth storage system 500 that includes an expandable load port, according to one or more aspects of the present disclosure.
Figure 14:
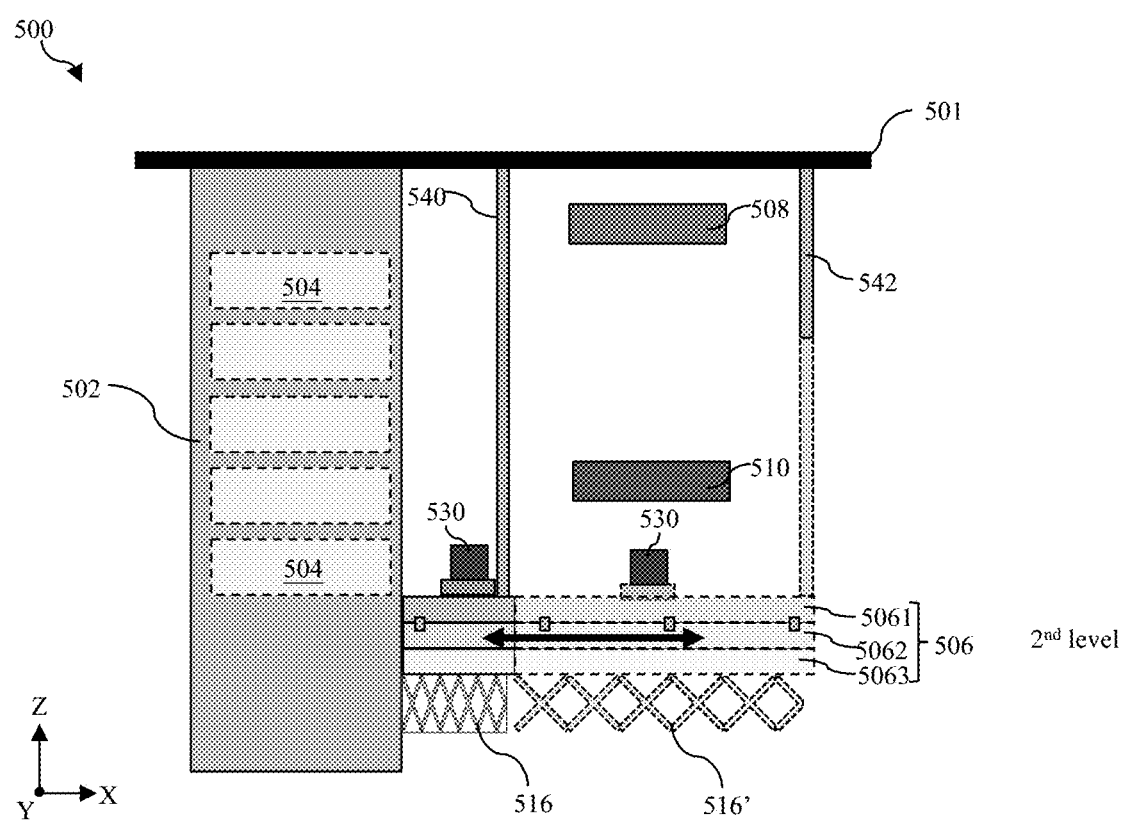

FIGS. 13 and 14 illustrate a fourth storage system 500. The fourth storage system 500 includes a storage device 502 hung from a ceiling 501. The storage device 502 may be a vertical stocker or a tower that includes multiple storage locations 504. The fourth storage system 500 further includes a first track 508 and a second track 510 disposed below the first track 508. In the embodiments illustrated in FIGS. 13-14, the storage locations 504 are arranged vertically. The fourth storage system 500 further includes an expandable load port 506. In the depicted embodiments, the expandable load port 506 is supported by a scissor-type extension arm 516. When the expandable load port 506 is in a retracted position, the scissor-type extension arm 516 stays retracted. When the expandable load port 506 extends, it enters into an extended position 516' (or extended mode 516'). When retracted, the expandable load port 506 may move between a first level shown in FIG. 13 and a second level shown in FIG. 14. When at the first level, the expandable load port 506 is configured to receive from or unload to an OHT vehicle travelling on the first track 508. When at the second level, the expandable load port 506 is configured to receive from or unload to an OHT vehicle travelling on the second track 510.

To maintain the structural integrity of the expandable load port 506, the expandable load port 506 is supported by at least one retractable hanger, such as a first hanger 540 and a second hanger 542 hung from the ceiling 501. Lengths of both the first hanger 540 and the second hanger 542 may change to support the expandable load port 506 at the first level and the second level. For example, the first hanger 540 and the second hanger 542 are in retracted positions in FIG. 13 to support the expandable load port 506 at the first level. To move clear of the second track 510, the expandable load port 506 retracts to the retracted position. The retracted expandable load port 506 is then lowered to the second level. In some embodiments, the lowering of the expandable load port 506 may be achieved with the assistance of the first hanger 540. While not explicitly shown in FIGS. 13 and 14, when the expandable load port 506 retracts, it disengages or break free from the second hanger 542 and is only supported by the first hanger 540.

Figure 15:
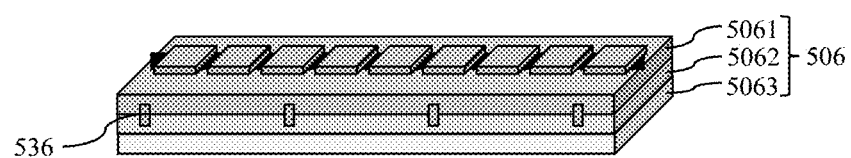
FIGS. 15-18 illustrate enlarged perspective views of the expandable load port of the fourth storage system 500 in FIGS. 13 and 14, according to one or more aspects of the present disclosure.
Figure 16:
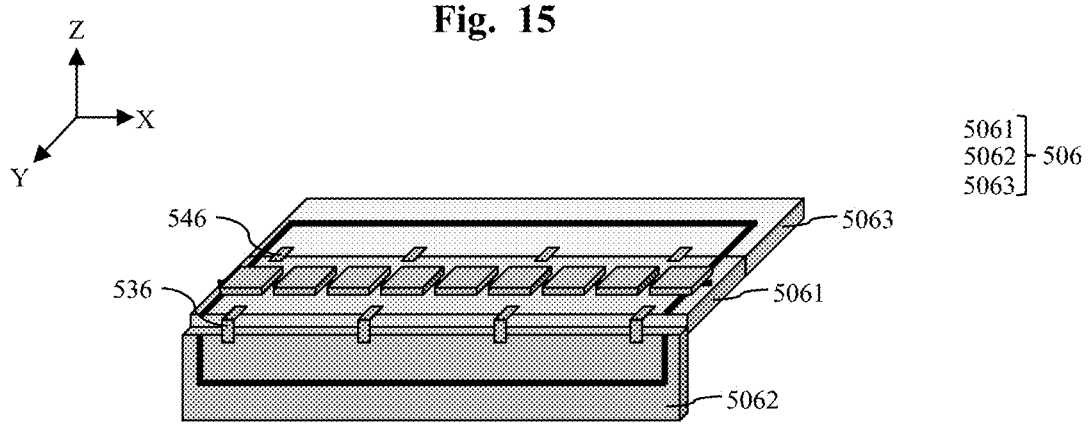
Figure 17:
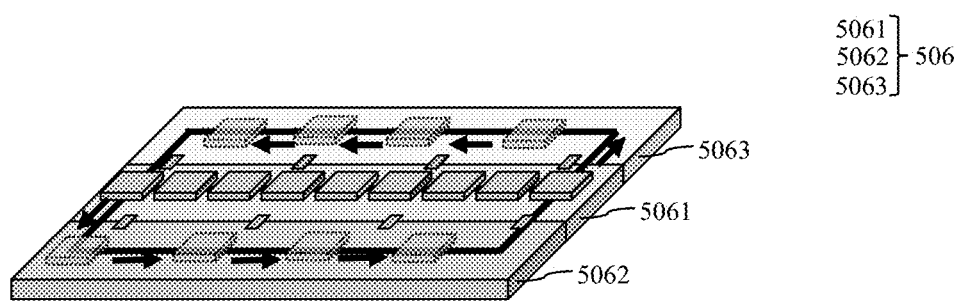
Figure 18:
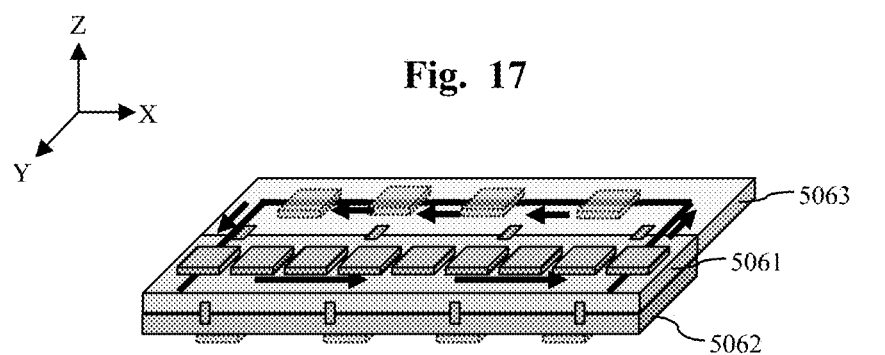

Different from the retractable load port 306 in FIGS. 7 and 8, the expandable load port 506 in FIGS. 13 and 14 is expandable to increase its dimension along the Y direction. The expandable load port 506 includes a plurality of plates that are pivotably connected. In the depicted embodiments, the expandable load port 506 includes a first plate 5061, a second plate 5062, and a third plate 5063. In FIGS. 13 and 14, the first plate 5061, the second plate 5062, and the third plate 5063 fold over one another and may unfold until the three plates extend on the same plane. FIGS. 15-18 provided enlarged views of the expandable load port 506. Referring to FIG. 15, the first plate 5061, the second plate 5062, and the third plate 5063 are folded one over another. The first plate 5061 is pivotably connected to the second plate 5062 by way of first hinges 536 and to the third plate 5063 by way of second hinges 546 (not explicitly shown in FIG. 15 but shown in FIG. 16). In some embodiments, the third plate 5063 may swing counterclockwise relative to the first plate 5061 and the second plate 5062 may swing clockwise relative to the first plate 5061. FIG. 16 illustrates a first partial expanded position of the expandable load port 506 where the first plate 5061 and the third plate 5063 form a coplanar plane while the second plate 5062 hangs from the first plate. FIG. 17 illustrates a full expanded position of the expandable load port 506 where the first plate 5061, the second plate 5062 and the third plate 5063 form a coplanar plane. In other words, the first plate 5061, the second plate 5062 and the third plate 5063 together form a load table similar to the load table 360 in FIG. 11 FIG. 18 illustrates a second partial expanded position of the expandable load port 506 where the second plate 5062 folds completely onto a bottom surface of the first plate 5061.

Depending on the position of the expandable load port 506, loads 530 on the expandable load port 506 may move in different routes or loops. In a closed position shown in FIG. 15, loads 530 on the expandable load port 506 may only move linearly along the X direction on the first plate 5061, either towards the storage device 502 or away from the storage device 502. In the first partial expanded position shown in FIG. 16, loads 530 on the expandable load port 506 may move around a closed loop that spans across the first plate 5061 and the third plate 5063. In the full expanded position shown in FIG. 17, loads 530 on the expandable load port 506 may move around a closed loop that spans across the first plate 5061, the second plate 5062 and the third plate 5063. In the second partial expanded position shown in FIG. 18, loads 530 on the expandable load port 506 may move around a loop that spans across the first plate 5061 and the third plate 5063.

Figure 19:
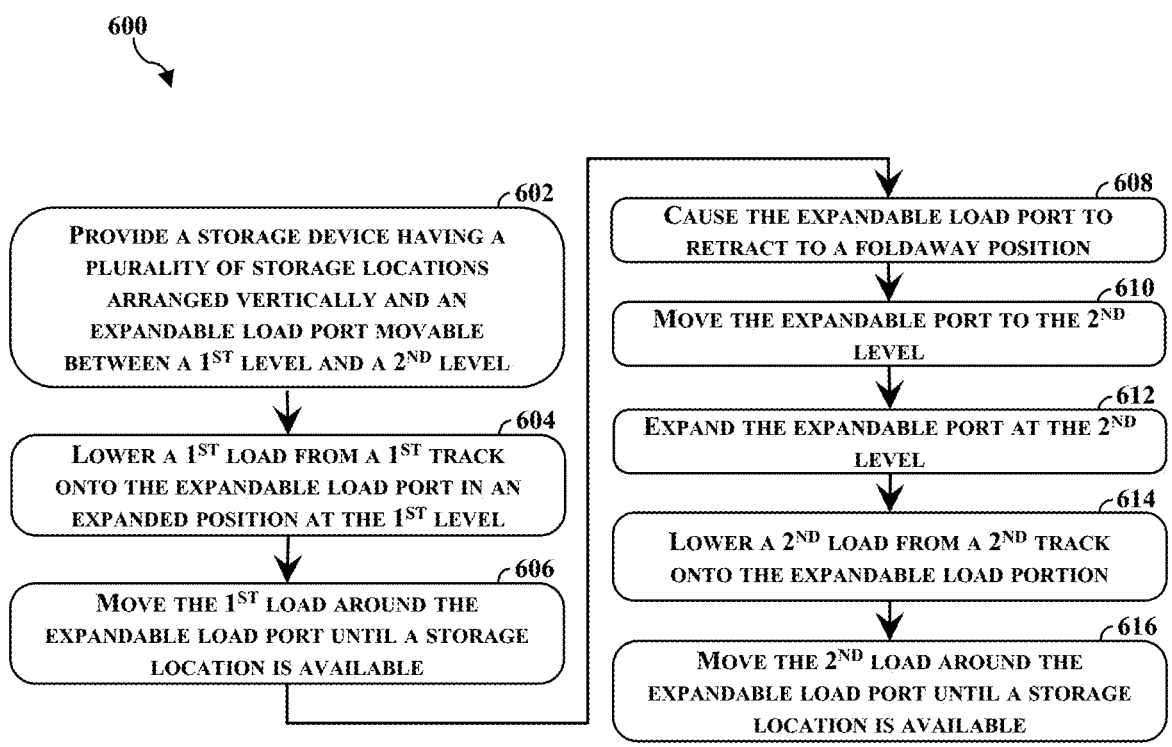
FIG. 19 illustrates a flowchart of a method 600 to use the fourth storage system 500 shown in FIGS. 13 and 14 to increase storage buffer, according to one or more aspects of the present disclosure.

FIG. 19 illustrates a flowchart of a method 600 of using the fourth storage system 500 shown in FIGS. 13 and 14. Method 600 is merely an example and is not intended to limit the present disclosure to what is explicitly illustrated in method 600. Additional steps may be provided before, during and after method 600, and some steps described can be replaced, eliminated, or moved around for additional embodiments of the methods. Not all steps are described herein in detail for reasons of simplicity. Method 600 is described below in conjunction with FIGS. 13-18.

As illustrated in FIG. 19, method 600 includes blocks 602, 604, 606, 608, 610, 612, 614, and 616. At block 602, a storage device, such as the storage device 502 in FIGS. 13 and 14, is provided. The storage device includes a plurality of storage locations, such as the storage locations 504 shown in FIGS. 1-4, arranged vertically one over another. Additionally, the storage system includes an expandable load port, such as the expandable load port 506 shown in FIGS. 13-18, that is movable between a first level and a second level. At block 604, a first load (such as a load 530 in FIG. 13) is lowered from a first track (such as the first track 508 shown in FIG. 13) onto the expandable load port (such as the expandable load port 506) while it is in an expanded position at the first level. At block 606, the expandable load port 506 may partially or fully expandable such that the first load may be moved around on the expandable load port 506. When the expandable load port has multiple plates pivotally connected by hinges, at least two plates form a coplanar surface or a load table on which the load is moved around in loops. In some embodiments, the load is moved around until a storage location (such as a storage location 504 shown in FIGS. 13 and 14) is vacant to receive the load. At block 608, in order to move clear of the second track (such as the second track 510 shown in FIGS. 13 and 14), the expandable load port folds up and retracts to a retracted position. At block 610, the expandable load port is moved or lowered to a second level while it is in the retracted position. At block 612, expandable load port extends and expands to a partial expanded position or a full expanded position at the second level. At block 614, a second load (such as another load 530 in FIG. 14) is lowered onto the expandable load port. At block 616, the second load is moved around the partially expanded or fully expanded expandable load port until a storage location is available. While not explicitly provided in FIG. 19, the expandable load port may fold and retract again, in order to move back to the first level after the conclusion of operations at block 616.

Figure 20:
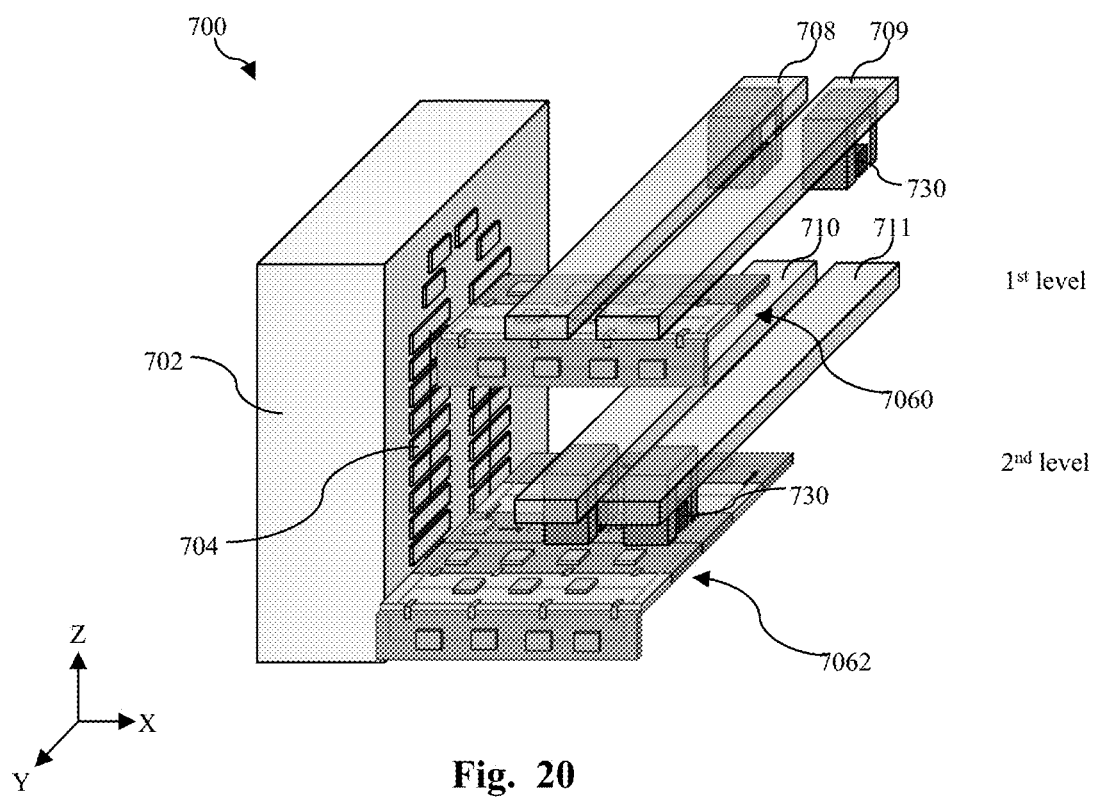
FIG. 20 illustrates a perspective view of a fifth storage system 700 that includes rotational and expandable load ports, according to one or more aspects of the present disclosure.

FIG. 20 illustrates a fifth storage system 700. The fifth storage system 700 includes a storage device 702. The storage device 702 may be a vertical stocker, a tower, or a vertical carousel. Like the storage device 102 in FIG. 1, the storage device 702 may include multiple storage locations 704 arranged in an upright stadium shape. Further, the storage locations 704 may move around the upright stadium shape. The fifth storage system 700 further includes a first track 708 and a second track 709 disposed side-by-side and a third track 710 and a fourth track 711 disposed side-by-side. As shown in FIG. 20, the first track 708 and the second track 709 are disposed directly over the third track 710 and the fourth track 711, respectively. The fifth storage system 700 further includes more than one expandable load port, such as a first expandable load port 7060 and a second expandable load port 7062. Each of the first expandable load port 7060 and the second expandable load port 7062 includes a plurality of plates pivotably connected by hinges. As such, each of the first expandable load port 7060 and the second expandable load port 7062 may expand or fold like the expandable load port 506 shown in FIGS. 13 and 14. Additionally, each of the first expandable load port 7060 and the second expandable load port 7062 may retract to move clear of the first track 708 and the third track 710 clockwise and counterclockwise around the upright stadium shape. As shown in FIG. 20, when in position and expanded, the first expandable load port 7060 and the second expandable load port 7062 may independently receive loads 730 from or unload loads 730 to OHT vehicles travelling on the first track 708 and the second track 709 when they are at the first level. Similarly, they may independently receive loads 730 from or unload loads 730 to OHT vehicles travelling on the third track 710 and the fourth track 711 when they are at the second level. Loads 730 on the first expandable load port 7060 and the second expandable load port 7062 may be moved around multiple plates until a storage location become available. It should be appreciated that the fifth storage system 700 is likely to provide the most load buffer to prevent a gridlock.

In one aspect of the present disclosure, a storage system is provided. The storage system includes a storage device that includes a plurality of storage locations arranged in an upright stadium shape, and a plurality of load ports each movable to engage any of the plurality of storage locations.

In some embodiments, each of the plurality of load ports is movable clockwise or counterclockwise around the upright stadium shape. In some implementations, each of the plurality of load ports includes a conveyor belt or motorized conveyor rollers. In some instances, the storage device is disposed adjacent a first track and a second track disposed directly above the first track. In some embodiments, each the plurality of load ports is movable around the upright stadium shape to a first loading location to receive a first load from a first vehicle that travels along the first track and a second loading location to receive a second load from a second vehicle that travels along the second track. In some embodiments, each of the first load and the second load includes a wafer container or a reticle box. In some implementations, the first track and the second track are spaced apart from the storage device by a first distance, each of the plurality of load ports is retractable towards the storage device such that a terminal end of each of the plurality of load ports is at a second distance away from the storage device, each of the plurality of load ports is extendable away from the storage device such that the terminal end of each of the plurality of load ports is at a third distance away from the storage device. The second distance is smaller than the first distance and the third distance is greater than the first distance. In some instances, the storage system further includes a scissor-type extension arm disposed below each of the plurality of load ports. In some implementations, the plurality of storage locations are defined in a vertical carousel such that the plurality of storage locations are movable along the upright stadium shape.

In another aspect of the present disclosure, a storage system is provided. The storage system includes a vertical stocker having a plurality of storage locations, a first track and a second track disposed adjacent the vertical stocker, the first track being disposed directly over the second track, a retractable load port vertically movable between a first level to receive a first load from a first vehicle travelling on the first track and a second level to receive a second load from a second vehicle travelling on the second track. The retractable load port is switchable between an extended mode at the first level and second level and a retracted mode when moving between the first level and the second level.

In some embodiments, the storage system further includes a first hanger hung from a ceiling over the vertical stocker and permanently attached to the retractable load port. The first hanger is vertically movable between the first level and the second level. In some implementations, the storage system further includes a second hanger hung from the ceiling over the vertical stocker and spaced apart from the first hanger. The second hanger includes a roller mechanism, the retractable load port includes a rail, and the rail is configured to slidably engage the roller mechanism such that the second hanger supports at least a portion of a weight of the retractable load port. In some instances, the second hanger is vertically movable between the first level and the second level. In some instances, each of the first load and the second load includes a wafer container or a reticle box. In some implementations, the storage system further includes a scissor-type extension arm disposed below the retractable load port. In some embodiments, the first track and the second track are spaced apart from the vertical stocker by a first distance, the retractable load port is retractable towards the vertical stocker such that a terminal end of the retractable load port is at a second distance away from the vertical stocker, the retractable load port is extendable away from the vertical stocker such that the terminal end of the retractable load port is at a third distance away from the vertical stocker, the second distance is smaller than the first distance, and the third distance is greater than the first distance.

In yet another aspect of the present disclosure, a storage system is provided. The storage system includes a storage device including a plurality of storage locations disposed one over another and a load table disposed adjacent the storage device. The load table includes a closed loop conveyor disposed over a top surface of the load table.

In some embodiments, the closed loop conveyor includes a conveyor belt or motorized conveyor rollers. In some implementations, the load table further includes a delivery track to selectively transport a load into one of the plurality of storage locations. In some instances, the storage system further includes a plurality of tracks spanning over the load table. The plurality of tracks are spaced apart from one another horizontally.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. It is understood that various different combinations of the above-listed processing steps can be used in combination or in parallel. Also, features illustrated and discussed above with respect to some embodiments can be combined with features illustrated and discussed above with respect to other embodiments. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A storage system, comprising:
a storage device comprising a plurality of storage locations arranged in an upright stadium shape;
a plurality of load ports each movable to engage any of the plurality of storage locations; and a first track and a second track extending lengthwise along a first direction and spaced part from the storage device by a first distance along a second direction perpendicular to the first direction,
wherein the second track is disposed directly above the first track,
wherein each the plurality of load ports is movable around the upright stadium shape to a first loading location to receive a first load from a first vehicle that travels along the first track and a second loading location to receive a second load from a second vehicle that travels along the second track.

2. The storage system of claim 1, wherein each of the plurality of load ports is movable clockwise or counterclockwise around the upright stadium shape.

3. The storage system of claim 1, wherein each of the plurality of load ports comprises a conveyor belt or motorized conveyor rollers.

4. The storage system of claim 1, wherein each of the first load and the second load comprises a wafer container or a reticle box.

5. The storage system of claim 1,
wherein each of the plurality of load ports is retractable towards the storage device such that a terminal end of each of the plurality of load ports is at a second distance away from the storage device,
wherein each of the plurality of load ports is extendable away from the storage device such that the terminal end of each of the plurality of load ports is at a third distance away from the storage device,
wherein the second distance is smaller than the first distance,
wherein the third distance is greater than the first distance.

6. The storage system of claim 5, further comprising:
a scissor-type extension arm disposed below each of the plurality of load ports.

7. The storage system of claim 1, wherein the plurality of storage locations are defined in a vertical carousel such that the plurality of storage locations are movable along the upright stadium shape.

8. A storage system, comprising:
a vertical stocker comprising a plurality of storage locations;
a first track and a second track spaced apart from the vertical stocker by a distance along a first direction, the first track being disposed directly over the second track, the first track and the second track extending lengthwise along a second direction perpendicular to the first direction; and
a retractable load port vertically movable between a first level to receive a first load from a first vehicle travelling on the first track and a second level to receive a second load from a second vehicle travelling on the second track,
wherein the retractable load port is switchable between an extended mode at the first level and second level and a retracted mode when moving between the first level and the second level,
wherein the retractable load port in the extended mode comprises a first length greater than the distance,
wherein the retractable load port in the retracted mode comprises a second length smaller than the distance.

9. The storage system of claim 8, further comprising:
a first hanger hung from a ceiling over the vertical stocker and permanently attached to the retractable load port,
wherein the first hanger is vertically movable between the first level and the second level.

10. The storage system of claim 9, further comprising:
a second hanger hung from the ceiling over the vertical stocker and spaced apart from the first hanger,
wherein the second hanger includes a roller mechanism,
wherein the retractable load port includes a rail,
wherein the rail is configured to slidably engage the roller mechanism such that the second hanger supports at least a portion of a weight of the retractable load port.

11. The storage system of claim 10, wherein the second hanger is vertically movable between the first level and the second level.

12. The storage system of claim 8, wherein each of the first load and the second load comprises a wafer container or a reticle box.

13. The storage system of claim 8, further comprising a scissor-type extension arm disposed below the retractable load port.

14. The storage system of claim 8,
wherein the first track and the second track are spaced apart from the vertical stocker by a first distance,
wherein the retractable load port is retractable towards the vertical stocker such that a terminal end of the retractable load port is at a second distance away from the vertical stocker,
wherein the retractable load port is extendable away from the vertical stocker such that the terminal end of the retractable load port is at a third distance away from the vertical stocker,
wherein the second distance is smaller than the first distance,
wherein the third distance is greater than the first distance.

15. A storage system, comprising:
a storage device comprising a plurality of storage locations disposed one over another;
a load table disposed adjacent the storage device; and
a plurality of tracks spanning over the load table,
wherein the load table comprises a closed loop conveyor disposed over a top surface of the load table,
wherein the plurality of tracks are spaced apart from one another horizontally.

16. The storage system of claim 15, wherein the closed loop conveyor comprises a conveyor belt or motorized conveyor rollers.

17. The storage system of claim 15, wherein the load table further comprises a delivery track to selectively transport a load into one of the plurality of storage locations.

18. The storage system of claim 15, further comprising:
overhead hoist transport vehicles configured to travel on the plurality of tracks.

19. The storage system of claim 1, wherein the first vehicle and the second vehicle are overhead hoist transport vehicles.

20. The storage system of claim 1, wherein the first vehicle comprises a gripper to load and unload the first load.

* * * * *